United States Patent
Ozawa et al.

(10) Patent No.: US 8,916,069 B2
(45) Date of Patent: *Dec. 23, 2014

(54) CONDUCTIVE COMPOSITIONS CONTAINING RHODIUM AND PB-TE-O AND THEIR USE IN THE MANUFACTURE OF SEMICONDUCTOR DEVICES

(75) Inventors: Kazutaka Ozawa, Kanagawa (JP); Lai-Ching Chou, Taipei (TW)

(73) Assignee: E I du Pont de Nemours and Company, Wilmington, DE (US)

( * ) Notice: Subject to any disclaimer, the term of this patent is extended or adjusted under 35 U.S.C. 154(b) by 278 days.

This patent is subject to a terminal disclaimer.

(21) Appl. No.: 13/572,871

(22) Filed: Aug. 13, 2012

(65) Prior Publication Data

US 2013/0043441 A1     Feb. 21, 2013

Related U.S. Application Data

(60) Provisional application No. 61/524,906, filed on Aug. 18, 2011.

(51) Int. Cl.
*H01B 1/22* (2006.01)
*B05D 5/12* (2006.01)
*H01L 31/0224* (2006.01)

(52) U.S. Cl.
CPC .......... *H01B 1/22* (2013.01); *H01L 31/022425* (2013.01); *Y02E 10/50* (2013.01)
USPC .............................. 252/514; 427/58; 136/252

(58) Field of Classification Search
CPC ........ H01B 1/16; H01B 1/22; H01L 41/0477; H05K 1/092; C03C 8/02; C03C 8/18; C09D 5/24; C09J 9/02
USPC .............. 252/512–514; 427/58; 136/252–256
See application file for complete search history.

(56) References Cited

U.S. PATENT DOCUMENTS

| | | | | |
|---|---|---|---|---|
| 5,066,621 | A | * | 11/1991 | Akhtar .............................. 501/41 |
| 5,183,784 | A | * | 2/1993 | Nguyen et al. ................... 501/19 |
| 5,378,408 | A | | 1/1995 | Carroll et al. |
| 5,663,109 | A | * | 9/1997 | Dietz et al. ....................... 501/41 |
| 7,727,424 | B2 | | 6/2010 | Konno |
| 7,851,012 | B2 | | 12/2010 | Konno |
| 2009/0255584 | A1 | | 10/2009 | Carroll |
| 2011/0232746 | A1 | * | 9/2011 | Carroll et al. .................. 136/256 |

FOREIGN PATENT DOCUMENTS

| KR | 20130043591 | * | 4/2013 |
|---|---|---|---|
| WO | WO93/02980 | * | 2/1993 |

OTHER PUBLICATIONS

U.S. Appl. No. 13/100,550, filed May 4, 2011, Carroll et al.
U.S. Appl. No. 13/100,563, filed May 4, 2011, Carroll et al.
U.S. Appl. No. 13/100,533, filed May 4, 2011, Carroll et al.
U.S. Appl. No. 13/100,619, filed May 4, 2011, Mikeska et al.
U.S. Appl. No. 13/438,093, filed Apr. 3, 2012, Hang et al.

* cited by examiner

*Primary Examiner* — Mark Kopec

(57) ABSTRACT

The present invention is directed to an electrically conductive composition comprising (a) an electrically conductive metal; (b) a Rh-containing component; (c) a Pb—Te—O; and (d) an organic medium; wherein the electrically conductive metal, the Rh-containing compound, and the Pb—Te—O are dispersed in the organic medium. The present invention is further directed to an electrode formed from the composition and a semiconductor device and, in particular, a solar cell comprising such an electrode. Also provided is a process for forming such an electrode. The electrodes provide good adhesion and good electrical performance.

10 Claims, 1 Drawing Sheet

CONDUCTIVE COMPOSITIONS CONTAINING RHODIUM AND PB-TE-O AND THEIR USE IN THE MANUFACTURE OF SEMICONDUCTOR DEVICES

FIELD OF THE INVENTION

The present invention is directed primarily to an electrically conductive composition, e.g., a thick-film paste or ink, and electrodes formed from the electrically conductive composition. It is further directed to a silicon semiconductor device and, in particular, it pertains to the use of the electrically conductive composition in the formation of an electrode of a solar cell.

TECHNICAL BACKGROUND OF THE INVENTION

A conventional solar cell structure with a p-type base has a negative electrode that is typically on the front-side or sun side of the cell and a positive electrode on the back side. Radiation of an appropriate wavelength falling on a p-n junction of a semiconductor body serves as a source of external energy to generate electron-hole pairs in that body. Because of the potential difference which exists at a p-n junction, holes and electrons move across the junction in opposite directions and thereby give rise to a flow of electric current that is capable of delivering power to an external circuit. Most solar cells are in the form of a silicon wafer that has been metalized, i.e., provided with metal electrodes that are electrically conductive. Typically thick-film pastes or inks (sometimes referred to simply as "pastes" hereafter) are screen-printed onto the substrate and fired to form the electrodes.

The front or sun side of the silicon wafer is often coated with an anti-reflective coating (ARC) to prevent reflective loss of incoming sunlight, thus increasing the efficiency of the solar cell. Typically, a two-dimensional electrode grid pattern, i.e. "front electrode," makes a connection to the n-side of the silicon, and a coating of aluminum on the opposite side (back electrode) makes connection to the p-side of the silicon. These contacts are the electrical outlets from the p-n junction to the outside load.

The front electrodes of silicon solar cells are generally formed by screen-printing a paste. Typically, the paste contains electrically conductive particles, glass frit and an organic medium. After screen-printing, the wafer and paste are fired in air, typically at furnace setpoint temperatures of about 650-1000° C. for a few seconds to form a dense solid of electrically conductive traces. The organic components are burned away in this firing step. Also during this firing step, the glass frit and any added flux reacts with and etches through the anti-reflective coating and facilitates the formation of intimate silicon-electrode contact. The glass frit and any added flux also provide adhesion to the substrate and aid in the adhesion of subsequently soldered leads to the electrode. Good adhesion to the substrate and high solder adhesion of the leads to the electrode are important to the performance of the solar cell as well as the manufacturability and reliability of the solar modules.

There is an on-going effort to provide paste compositions that result in improved solder adhesion while maintaining electrical performance.

SUMMARY OF THE INVENTION

The present invention provides an electrically conductive composition comprising:

(a) an electrically conductive metal;
(b) a Rh-containing component;
(c) a Pb—Te—O; and
(d) an organic medium;

wherein the electrically conductive metal, the Rh-containing component, and the Pb—Te—O are dispersed in the organic medium.

The present invention provides a process for forming an electrode, the process comprising:

(a) providing an article comprising a semiconductor substrate;
(b) applying a composition onto the article, the composition comprising:
   i) an electrically conductive metal;
   ii) a Rh-containing component;
   iii) a Pb—Te—O; and
   iv) an organic medium;
   wherein said electrically conductive metal, said Rh-containing compound, and said Pb—Te—O are dispersed in said organic medium; and
(c) firing the article and the composition wherein the organic medium of the thick film paste is volatilized, thereby forming the electrode.

The invention also provides a semiconductor device, and in particular, a solar cell, comprising an electrode formed from the instant composition, wherein the composition has been fired to remove the organic medium and form the electrode. The electrode in the present invention has improved solder adhesion while maintaining electrical performance.

Figure 1A:
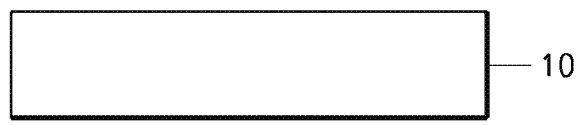
FIGS. 1A-1F illustrate the fabrication of a semiconductor device. Reference numerals shown in FIG. 1 are explained below.

10: p-type silicon substrate
20: n-type diffusion layer
30: ARC (e.g., silicon nitride film, titanium oxide film, or silicon oxide film)
40: p+ layer (back surface field, BSF)
60: aluminum paste deposited on back side
61: aluminum back side electrode (obtained by firing back side aluminum paste)
70: silver/aluminum paste deposited on back side
71: silver/aluminum back side electrode (obtained by firing back side silver/aluminum paste)
500: paste of the instant invention deposited on front side
501: front electrode (formed by firing front side paste 500)

DETAILED DESCRIPTION OF THE INVENTION

The electrically conductive composition of the instant invention simultaneously provides the ability to form an electrode wherein the electrode has good electrical and improved adhesion properties. The composition will typically be in the form of a thick-film paste or an ink that can be printed or applied with the desired pattern, such as by screen-printing, plating, ink-jet printing, extrusion, shaped or multiple printing, or ribbons.

The electrically conductive composition comprises an electrically conductive metal, a Rh-containing component, a Pb—Te—O, and an organic medium. In one embodiment, the composition comprises 75 to 92 wt % electrically conductive metal, 0.001 to 10 wt % rhodium-containing compound, 0.5 to 10 wt % Pb—Te—O and 5 to 25 wt % organic medium, wherein the wt % are based on the total weight of the composition.

Each constituent of the composition of the present invention is explained in detail below.

Electrically Conductive Metal

The electrically conductive metal comprises a metal selected from the group consisting of silver (Ag), nickel (Ni), copper (Cu), aluminum (Al), palladium (Pd), ruthenium (Ru) and mixtures thereof. The source of the electrically conductive metal can be in a flake form, a spherical form, a granular form, a crystalline form, a powder, or other irregular forms and mixtures thereof. The electrically conductive metal can be provided in a colloidal suspension. In one embodiment the composition contains 75-92 wt % electrically conductive metal, wherein the wt % is based on the total weight of the composition.

In one embodiment, the electrically conductive metal is silver (Ag). The silver can be in the form of silver metal, alloys of silver, or mixtures thereof. Typically, in a silver powder, the silver particles are in a flake form, a spherical form, a granular form, a crystalline form, other irregular forms and mixtures thereof. The silver can be provided in a colloidal suspension. The silver can also be in the form of silver oxide ($Ag_2O$), silver salts such as AgCl, $AgNO_3$, AgO-$OCCH_3$ (silver acetate), $AgOOCF_3$ (silver trifluoroacetate), silver orthophosphate ($Ag_3PO_4$), or mixtures thereof. Other forms of silver compatible with the other constituents can also be used.

In one embodiment, the purity of the silver powder or silver particles is 95 wt % or greater.

In one embodiment, the electrically conductive composition comprises coated silver particles that are electrically conductive. Suitable coatings include surfactants and phosphorous-containing compounds. Suitable surfactants include polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The salt counter-ions can be ammonium, sodium, potassium, and mixtures thereof.

The particle size of the silver is not subject to any particular limitation. In one embodiment, the average particle size is less than 10 microns; in another embodiment, the average particle size is in the range of 1 to 6 microns.

Rhodium-Containing Component

The rhodium (Rh)-containing component may be selected from any convenient source of rhodium.

In an embodiment, the conductive composition contains 0.001 to 10 wt % rhodium-containing component, wherein the wt % is based on the total weight of the conductive composition. In a further embodiment, the conductive composition contains 0.05 to 7 wt % rhodium-containing component, wherein the wt % is based on the total weight of the conductive composition. In a still further embodiment, the conductive composition contains 0.06 to 5 wt % rhodium-containing component, wherein the wt % is based on the total weight of the conductive composition. In yet another embodiment, the conductive composition contains 0.09 to 2 wt % rhodium-containing component, wherein the wt % is based on the total weight of the conductive composition.

In one embodiment, the Rh-containing component is selected from the group consisting of Rh resinate, Rh containing metal powder, Rh oxide ($RhO_2$, $Rh_2O_3$), Rh bromide ($RhBr_2$, $RhBr_3$), Rh chloride ($RhCl_2$, $RhCl_3$), Rh fluoride ($RhF_3$, $RhF_4$, $RhF_5$, $RhF_6$), Rh iodide ($RhI_2$.$RhI_3$), rhodium-diacetate ($Rh(CH_3COO)_2$), $Rh(CN)_3$, $Rh_4(CO)_{12}$, rhodium nitrate ($Rh(NO_3)_3$), rhodium hydroxide ($Rh(OH)_3$, $Rh(OH)_4$) and mixtures thereof.

In another embodiment, the Rh-containing component is Rh resinate. The Rh resinate is an organic metal compound containing a bond(s) between carbon and Rh. In an embodiment, the Rh resinate can be expressed by formula (I).

$$Rh(XR)_n \qquad (I)$$

In formula (I), X is —S—, —O(CO)—, or —SO3-. R is a linear, branched or cyclic hydrocarbon having 1 to 10 carbon atoms, such as methyl, ethyl, n-propyl, isopropyl, cyclopropyl, n-butyl, isobutyl, t-butyl, cyclobutyl, n-pentyl, cyclopentyl or other pentyl groups, n-hexyl, cyclohexyl or other hexyl groups, n-heptyl or other heptyl groups, n-octyl or other octyl groups, n-nonyl or other nonyl groups, n-decyl or other decyl groups, and n is 1, 2 or 3.

In an embodiment, the Rh is 0.01 to 3 wt %, in another embodiment 0.3 to 2 wt %, and in a still further embodiment 0.5 to 1 wt %, based on the total weight of the conductive composition.

Lead-Tellurium-Oxide

A component of the paste composition is a lead-tellurium-lithium-titanium-oxide (Pb—Te—O). In an embodiment, this oxide may be a glass composition, e.g., a glass frit. In a further embodiment, this oxide may be crystalline, partially crystalline, amorphous, partially amorphous, or combinations thereof. In an embodiment, the Pb—Te—O may include more than one glass composition. In an embodiment, the Pb—Te—O composition may include a glass composition and an additional composition, such as a crystalline composition.

In an embodiment, Pb—Te—O is 0.5 to 10 wt %, based on the total weight of the conductive composition. In another embodiment, Pb—Te—O is 1 to 7 wt %, in still another embodiment, 1.2 to 5 wt %, and in a further embodiment, 1.5 to 3 wt %, based on the total weight of the conductive composition. In an embodiment, the Pb—Te—O can be a mixture two or more of glass frits.

The lead-tellurium-oxide (Pb—Te—O) may be prepared by mixing $TeO_2$, lead oxide and other oxides to be incorporated therein (or other materials that decompose into the desired oxides when heated) using techniques understood by one of ordinary skill in the art. The lead oxide may include one or more components selected from the group consisting of PbO, $Pb_3O_4$, and $PbO_2$. Such preparation techniques may involve heating the mixture in air or an oxygen-containing atmosphere to form a melt, quenching the melt, and grinding, milling, and/or screening the quenched material to provide a powder with the desired particle size. Melting the mixture of lead, tellurium and other oxides to be incorporated therein is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $d_{50}$ of 0.1 to 3.0 microns. One skilled in the art of producing glass frit may employ alternative synthesis techniques such as but not limited to water quenching, sol-gel, spray pyrolysis, or others appropriate for making powder forms of glass.

The oxide product of the above process is typically essentially an amorphous (non-crystalline) solid material, i.e., a glass. However, in some embodiments the resulting oxide may be amorphous, partially amorphous, partially crystalline, crystalline or combinations thereof. As used herein "glass" or "glass frit" includes all such products.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of ordinary skill in the art in glass chemistry, a certain portion of volatile species may be released during the process of making the glass. An example of a volatile species is oxygen. It should also be recognized that while the glass behaves as an amorphous material it will likely contain minor portions of a crystalline material.

If starting with a fired glass, one of ordinary skill in the art may calculate the percentages of starting components described herein using methods known to one of skill in the art including, but not limited to: Inductively Coupled Plasma-Mass Spectroscopy (ICP-MS), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; electron microprobe Energy Dispersive Spectroscopy (EDS); electron microprobe Wavelength Dispersive Spectroscopy (WDS); or Cathodo-Luminescence (CL).

One of ordinary skill in the art would recognize that the choice of raw materials could unintentionally include impurities that may be incorporated into the glass during processing. For example, the impurities may be present in the range of hundreds to thousands ppm. The presence of the impurities would not alter the properties of the glass, the composition, e.g. a thick-film composition, or the fired device. For example, a solar cell containing a thick-film composition may have the efficiency described herein, even if the thick-film composition includes impurities.

Typically, the mixture of PbO and $TeO_2$ powders includes 5 to 95 mol % of lead oxide and 5 to 95 mol % of tellurium oxide, based on the combined powders. In one embodiment, the mixture of PbO and $TeO_2$ powders includes 25 to 85 mol % of lead oxide and 15 to 75 mol % of tellurium oxide, based on the combined powders. In another embodiment, the mixture of PbO and $TeO_2$ powders includes 25 to 65 mol % of lead oxide and 35 to 75 mol % of tellurium oxide, based on the combined powders.

In some embodiments, the mixture of PbO and $TeO_2$ powders further includes one or more other metal compounds. Suitable other metal compounds include $TiO_2$, $LiO_2$, $B_2O_3$, $PbF_2$, $SiO_2$, $Na_2O$, $K_2O$, $Rb_2O$, $Cs_2O$, $Al_2O_3$, MgO, CaO, SrO, BaG, $V_2O_5$, $ZrO_2$, $MoO_3$, $Mn_2O_3$, $Ag_2O$, ZnO, $Ga_2O_3$, $GeO_2$, $In_2O_3$, $SnO_2$, $Sb_2O_3$, $Bi_2O_3$, $BiF_3$, $P_2O_5$, CuO, NiO, $Cr_2O_3$, $Fe_2O_3$, CoO, $Co_2O_3$, and $CeO_2$. Table 1 lists some examples of powder mixtures containing PbO, $TeO_2$ and other optional metal compounds that can be used to make lead-tellurium oxides. This list is meant to be illustrative, not limiting. In Table 1, the amounts of the compounds are shown as wt %, based on the weight of the total glass composition.

TABLE 1

| Powder mixture | Wt % PbO | Wt % $TeO_2$ | Wt % $PbF_2$ | Wt % $SiO_2$ | Wt % $B_2O_3$ | Wt % $P_2O_5$ | Wt % $SnO_2$ | Wt % $Ag_2O$ | Wt % $Li_2O$ |
|---|---|---|---|---|---|---|---|---|---|
| A | 32.95 | 67.05 | | | | | | | |
| B | 38.23 | 51.26 | 10.50 | | | | | | |
| C | 67.72 | 32.28 | | | | | | | |
| D | 72.20 | 27.80 | | | | | | | |
| E | 80.75 | 19.25 | | | | | | | |
| F | 59.69 | 9.30 | 16.19 | 14.82 | | | | | |
| G | 75.86 | 9.26 | | 14.88 | | | | | |
| H | 48.06 | 51.55 | | | | 0.39 | | | |
| I | 48.16 | 51.65 | | | 0.19 | | | | |
| J | 47.44 | 50.88 | 1.68 | | | | | | |
| K | 47.85 | 51.33 | | 0.82 | | | | | |
| L | 41.76 | 44.80 | | 0.32 | | | 0.80 | 12.32 | |
| M | 46.71 | 50.10 | | | | | | 3.19 | |
| N | 46.41 | 49.78 | | | | | | 3.80 | |
| O | 45.11 | 48.39 | | | | | | 6.50 | |
| P | 44.53 | 47.76 | | | | | | 7.71 | |
| Q | 48.05 | 51.54 | | | | | 0.41 | | |
| R | 47.85 | 51.33 | | | | | 0.82 | | |
| S | 47.26 | 50.70 | | | | | 2.04 | | |
| T | 45.82 | 49.19 | | | | | | | |
| U | 48.04 | 51.53 | | | | | | | |
| V | 39.53 | 28.26 | | | | | | | |
| W | 48.04 | 51.53 | | | | | | | 0.42 |

Therefore as used herein, the term "Pb—Te—O" may also include metal oxides that contain oxides of one or more elements selected from the group consisting of Si, Sn, Li, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, Bi, F, Zr, Mn, P, Cu, Ce, and Nb.

In one embodiment, the Pb—Te—O includes boron, i.e., the Pb—Te—O is Pb—Te—B—O. The starting mixture used to make the Pb—Te—B—O may include (based on the weight of the total starting mixture) PbO that may be 25 to 75 wt %, 30 to 60 wt %, or 30 to 50 wt %; $TeO_2$ that may be 10 to 70 wt %, 25 to 60 wt %, or 40 to 60 wt %; $B_2O_3$ that may be 0.1 to 15 wt %, 0.25 to 5 wt %, or 0.4 to 2 wt %.

In an embodiment, PbO, $TeO_2$, and $B_2O_3$ may be 80-100 wt % of the Pb—Te—B—O composition. In a further embodiment, PbO, $TeO_2$, and $B_2O_3$ may be 85-100 wt % or 90-100 wt % of the Pb—Te—B—O composition.

In a further embodiment, in addition to the above PbO, $TeO_2$, and $B_2O_3$, the starting mixture used to make the Pb—Te—B—O may include one or more of $PbF_2$, $SiO_2$, $BiF_3$, $SnO_2$, $Li_2O$, $Bi_2O_3$, ZnO, $V_2O_5$, $Na_2O$, $TiO_2$, $Al_2O_3$, CuO, $ZrO_2$, $CeO_2$, or $Ag_2O$. In an embodiment, one or more of these components may be 0-20 wt %, 0-15 wt %, or 0-10 wt % of the Pb—Te—B—O composition. In aspects of this embodiment (based on the weight of the total starting mixture):

the $PbF_2$ may be 0 to 20 wt %, 0 to 15 wt %, or 5 to 10 wt %;

the $SiO_2$ may be 0 to 11 wt %, 0 to 5 wt %, 0.25 to 4 wt %, or 0 to 0.5 wt %;

the $BiF_3$ may be 0 to 15 wt %, 0 to 10 wt %, or 1 to 10 wt %; the $SnO_2$ may be 0 to 5 wt %, 0 to 2 wt %, or 0.5 to 1.5 wt %;

the ZnO may be 0 to 5 wt %, 0 to 3 wt %, or 2 to 3 wt %;

the $V_2O_5$ may be 0 to 5 wt %, 0 to 1 wt %, or 0.5 to 1 wt %;

the $Na_2O$ may be 0 to 5 wt %, 0 to 3 wt %, or 0.1 to 1.5 wt %;

the CuO may be 0 to 5 wt %, 0 to 3 wt %, or 2 to 3 wt %;

the $ZrO_2$ may be 0 to 3 wt %, 0 to 2 wt %, or 0.1 to 1 wt %;

the $CeO_2$ may be 0 to 5 wt %, 0 to 3 wt %, or 0.1 to 2.5 wt %;

the $Li_2O$ may be 0 to 5 wt %, 0.1 to 3 wt %, or 0.25 to 2 wt %;

the $Bi_2O_3$ may be 0 to 15 wt %, 0 to 10 wt %, or 5 to 8 wt %;

the $TiO_2$ may be 0 to 5 wt %, 0.25 to 5 wt %, or 0.25 to 2.5 wt %;

the $Al_2O_3$ may be 0 to 3 wt %, 0 to 2 wt %, or 0.1 to 2 wt %; and the $Ag_2O$ may be 0 to 10 wt %, 1 to 10 wt %, or 1 to 8 wt %.

In an embodiment, the Pb—Te—B—O may be a homogenous powder. In a further embodiment, the Pb—Te—B—O may be a combination of more than one powder, wherein each powder may separately be a homogenous population. The composition of the overall combination of the multiple powders is within the ranges described above. For example, the Pb—Te—B—O may include a combination of two or more different powders; separately, these powders may have different compositions, and may or may not be within the ranges described above; however, the combination of these powders is within the ranges described above.

In an embodiment, the Pb—Te—B—O composition may include one powder which includes a homogenous powder including some but not all of the elements of the group Pb, Te, B, and O, and a second powder, which includes one or more of the elements of the group Pb, Te, B, and O. For example, the Pb—Te—B—O composition may include a first powder including Pb, Te, and O, and a second powder including $B_2O_3$. In an aspect of this embodiment, the powders may be melted together to form a uniform composition. In a further aspect of this embodiment, the powders may be added separately to a thick-film composition.

In an embodiment, some or all of the $Li_2O$ may be replaced with $Na_2O$, $K_2O$, $Cs_2O$, or $Rb_2O$, resulting in a glass composition with properties similar to the compositions listed above. In this embodiment, the total alkali metal oxide content may be 0 to 5 wt %, 0.1 to 3 wt %, or 0.25 to 3 wt %.

In a further embodiment, the Pb—Te—B—O composition(s) herein may include one or more of a third set of components: $GeO_2$, $Ga_2O_3$, $In_2O_3$, NiO, CoO, ZnO, CaO, MgO, SrO, MnO, BaO, $SeO_2$, $MoO_3$, $WO_3$, $Y_2O_3$, $As_2O_3$, $La_2O_3$, $Nd_2O_3$, $Bi_2O_3$, $Ta_2O_5$, $V_2O_5$, FeO, $HfO_2$, $Cr_2O_3$, CdO, $Sb_2O_3$, $PbF_2$, $ArO_2$, $Mn_2O_3$, $P_2O_5$, CuO, $Pr_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, $BiF_3$, SnO, $SiO_2$, $Ag_2O$, $Nb_2O_5$, $TiO_2$, $Rb_2O$, $SiO_2$, $Na_2O$, $K_2O$, $Cs_2O$, $Lu_2O_3$, $SnO_2$, and metal halides (e.g., NaCl, KBr, NaI, LiF, $ZnF_2$).

Therefore as used herein, the term "Pb—Te—B—O" may also include metal oxides that contain one or more oxides of elements selected from the group consisting of Si, Sn, Li, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, Bi, F, Zr, Mn, P, Cu, Ce, and Nb.

In another embodiment, the Pb—Te—O includes lithium, i.e., the Pb—Te—O is Pb—Te—Li—O. The starting mixture used to make the Pb—Te—Li—O may include (based on the weight of the total starting mixture): PbO that may be 30 to 60 wt %, 40 to 55 wt %, or 45 to 50 wt %; $TeO_2$ that may be 40 to 65 wt %, 45 to 60 wt %, or 50 to 55 wt %; and $Li_2O$ that may be 0.1 to 5 wt %, 0.2 to 3 wt %, or 0.3 to 1 wt %.

In a further embodiment, in addition to the above PbO, $TeO_2$, and $Li_2O$, the starting mixture used to make the Pb—Te—Li—O may include one or more of $SiO_2$, $SnO_2$, $B_2O_3$, $Ag_2O$, $BiF_3$, $V_2O_5$, $Na_2O$, $ZrO_2$, $TiO_2$, $CeO_2$, $Bi_2O_3$, $Nb_2O_5$, $Ta_2O_5$, $K_2O$, MgO, $P_2O_5$, $SeO_2$, $Co_3O_4$, PdO, $RuO_2$, NiO, ZnO, CuO, MnO, $Cr_2O_3$, or $Al_2O_3$. In aspects of this embodiment (based on the weight of the total starting mixture):

the $SiO_2$ may be 0 to 11 wt %, 0 to 5 wt %, 0.25 to 4 wt %, or 0 to 0.5 wt %;

the $SnO_2$ may be 0 to 5 wt %, 0 to 2 wt %, or 0.5 to 1.5 wt %;

the $B_2O_3$ may be 0 to 10 wt %, 0 to 5 wt %, or 0.5 to 5 wt %;

the $Ag_2O$ may be 0 to 30 wt %, 0 to 20 wt %, 3 to 15 wt % or 1 to 8 wt %;

the $TiO_2$ may be 0 to 5 wt %, 0.25 to 5 wt %, or 0.25 to 2.5 wt %;

the $PbF_2$ may be 0 to 20 wt %, 0 to 15 wt %, or 5 to 10 wt %;

the $BiF_3$ may be 0 to 15 wt %, 0 to 10 wt %, or 1 to 10 wt %;

the ZnO may be 0 to 5 wt %, 0 to 3 wt %, or 2 to 3 wt %;
the $V_2O_5$ may be 0 to 5 wt %, 0 to 1 wt %, or 0.5 to 1 wt %;
the $Na_2O$ may be 0 to 5 wt %, 0 to 3 wt %, or 0.1 to 1.5 wt %;
the CuO may be 0 to 5 wt %, 0 to 3 wt %, or 2 to 3 wt %;
the $ZrO_2$ may be 0 to 3 wt %, 0 to 2 wt %, or 0.1 to 1 wt %;
the $CeO_2$ may be 0 to 5 wt %, 0 to 3 wt %, or 0.1 to 2.5 wt %;
the $Bi_2O_3$ may be 0 to 15 wt %, 0 to 10 wt %, or 5 to 8 wt %; and
the $Al_2O_3$ may be 0 to 3 wt %, 0 to 2 wt %, or 0.1 to 2 wt %.

In an embodiment, the Pb—Te—Li—O may be a homogenous powder. In a further embodiment, the Pb—Te—Li—O may be a combination of more than one powder, wherein each powder may separately be a homogenous population. The composition of the overall combination of the two powders may be within the ranges described above. For example, the Pb—Te—Li—O may include a combination of two or more different powders; separately, these powders may have different compositions, and may or may not be within the ranges described above; however, the combination of these powders may be within the ranges described above.

In an embodiment, the Pb—Te—Li—O composition may include one powder which includes a homogenous powder including some but not all of the elements of the group Pb, Te, Li, and O, and a second powder, which includes one or more of the elements of the group Pb, Te, Li, and O.

In an embodiment, some or all of the $Li_2O$ may be replaced with $Na_2O$, $K_2O$, $Cs_2O$, or $Rb_2O$, resulting in a glass composition with properties similar to the compositions listed above. In this embodiment, the total alkali metal oxide content may be 0 to 5 wt %, 0.1 to 3 wt %, or 0.25 to 3 wt %.

In a further embodiment, the glass frit composition(s) herein may include one or more of a third set of components: $GeO_2$, $Ga_2O_3$, $In_2O_3$, NiO, CoO, ZnO, CaO, MgO, SrO, MnO, BaO, $SeO_2$, $MoO_3$, $WO_3$, $Y_2O_3$, $As_2O_3$, $La_2O_3$, $Nd_2O_3$, $Bi_2O_3$, $Ta_2O_5$, $V_2O_5$, FeO, $HfO_2$, $Cr_2O_3$, CdO, $Sb_2O_3$, $PbF_2$, $ZrO_2$, $Mn_2O_3$, $P_2O_5$, CuO, $La_2O_3$, $Pr_2O_3$, $Nd_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, $BiF_3$, SnO, $SiO_2$, $Ag_2O$, $Nb_2O_5$, $TiO_2$, and metal halides (e.g., NaCl, KBr, NaI, LiF).

Therefore as used herein, the term "Pb—Te—Li—O" may also include metal oxides that contain one or more elements selected from the group consisting of Si, Sn, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, Bi, F, Zr, Mn, P, Cu, Ce, and Nb.

Table 2 lists some examples of powder mixtures containing PbO, $TeO_2$, $Li_2O$ that can be used to make lead-tellurium-lithium-oxides. This list is meant to be illustrative, not limiting. In Table 2, the amounts of the compounds are shown as wt %, based on the weight of the total glass composition.

TABLE 2

| Glass # | PbO | $Li_2O$ | $TeO_2$ |
|---|---|---|---|
| 1 | 48.04 | 0.42 | 51.54 |
| 2 | 47.74 | 1.05 | 51.21 |

TABLE 2-continued

| Glass # | PbO | Li$_2$O | TeO$_2$ |
|---|---|---|---|
| 3 | 44.73 | 0.43 | 54.84 |
| 4 | 55.49 | 0.41 | 44.09 |
| 5 | 58.07 | 0.41 | 41.52 |
| 6 | 34.51 | 2.44 | 63.06 |
| 7 | 42.77 | 0.43 | 56.80 |
| 8 | 45.82 | 4.99 | 49.19 |
| 9 | 48.04 | 0.42 | 51.53 |
| 10 | 47.82 | 0.89 | 51.29 |
| 11 | 42.77 | 0.43 | 56.80 |
| 12 | 37.31 | 0.44 | 62.25 |
| 13 | 57.80 | 0.86 | 41.33 |
| 14 | 58.07 | 0.41 | 41.52 |

In still another embodiment, the Pb—Te—O includes lithium and titanium, i.e., the Pb—Te—O is Pb—Te—Li—Ti—O. The starting mixture used to make the Pb—Te—Li—Ti—O includes, based on the total weight of the starting mixture of the Pb—Te—Li—Ti—O, 25-65 wt % PbO, 25-70 wt % TeO$_2$, 0.1-5 wt % Li$_2$O and 0.1-5 wt % TiO$_2$. In one embodiment, the starting mixture used to make the Pb—Te—Li—Ti—O includes, based on the total weight of the starting mixture of the Pb—Te—Li—Ti—O, 30-60 wt % PbO, 30-65 wt % TeO$_2$, 0.25-3 wt % Li$_2$O and 0.25-5 wt % TiO$_2$. In another embodiment, the starting mixture includes 30-50 wt % PbO, 50-65 wt % TeO$_2$, 0.5-2.5 wt % Li$_2$O and 0.5-3 wt % TiO$_2$.

In any of the above embodiments, PbO, TeO$_2$, Li$_2$O$_3$, and TiO$_2$ may be 80-100 wt % of the Pb—Te—Li—Ti—O composition. In further embodiments, PbO, TeO$_2$, Li$_2$O$_3$, and TiO$_2$ may be 85-100 wt % or 90-100 wt % of the Pb—Te—Li—Ti—O composition.

In any of the above embodiments, in addition to the above PbO, TeO$_2$, Li$_2$O, and TiO$_2$, the Pb—Te—Li—Ti—O further comprises an oxide selected from the group consisting of SiO$_2$, SnO$_2$, B$_2$O$_3$, ZnO, Nb$_2$O$_5$, CeO$_2$, V$_2$O$_5$, Al$_2$O$_3$, Ag$_2$O and mixtures thereof. In aspects of this embodiment (based on the weight of the total starting mixture):

the SiO$_2$ may be 0 to 10 wt %, 0 to 9 wt %, or 2 to 9 wt %;
the SnO$_2$ may be 0 to 5 wt %, 0 to 4 wt %, or 0.5 to 1.5 wt %;
the B$_2$O$_3$ may be 0 to 10 wt %, 0 to 5 wt %, or 1 to 5 wt %; and
the Ag$_2$O may be 0 to 30 wt %, 0 to 20 wt %, or 3 to 15 wt %.

In addition, in any of the above embodiments, the glass frit composition herein may include one or more of a third set of components: GeO$_2$, Ga$_2$O$_3$, In$_2$O$_3$, NiO, ZnO, CaO, MgO, SrO, BaO, SeO$_2$, MoO$_3$, WO$_3$, Y$_2$O$_3$, As$_2$O$_3$, La$_2$O$_3$, Nd$_2$O$_3$, Bi$_2$O$_3$, Ta$_2$O$_5$, FeO, HfO$_2$, Cr$_2$O$_3$, CdO, Sb$_2$O$_3$, PbF$_2$, ZrO$_2$, Mn$_2$O$_3$, P$_2$O$_5$, CuO, Nb$_2$O$_5$, Rb$_2$O, Na$_2$O, K$_2$O, Cs$_2$O, Lu$_2$O$_3$, and metal halides (e.g., NaCl, KBr, NaI, LiF, ZnF$_2$).

Therefore as used herein, the term "Pb—Te—Li—Ti—O" may also contain oxides of one or more elements selected from the group consisting of Si, Sn, B, Ag, Na, K, Rb, Cs, Ge, Ga, In, Ni, Zn, Ca, Mg, Sr, Ba, Se, Mo, W, Y, As, La, Nd, Bi, Ta, V, Fe, Hf, Cr, Cd, Sb, Zr, Mn, P, Cu, Lu, Ce, Al and Nb.

Tables 3 and 4 list some examples of powder mixtures containing PbO, TeO$_2$, Li$_2$O, TiO$_2$, and other optional compounds that can be used to make lead-tellurium-lithium-titanium-oxides. This list is meant to be illustrative, not limiting. In Tables 3 and 4, the amounts of the compounds are shown as weight percent, based on the weight of the total Pb—Te—Li—Ti—O composition.

The lead-tellurium-lithium-titanium-oxide (Pb—Te—Li—Ti—O) compositions of Table 1 were prepared by mixing and blending amounts of Pb$_3$O$_4$, TeO$_2$, Li$_2$CO$_3$, and TiO$_2$ powders, and optionally, as shown in Table 3, SiO$_2$, B$_2$O$_3$, Ag$_2$O, and/or SnO$_2$ to provide compositions of the oxides with the weight percentages shown in Table 3, based on the weight of the total glass composition.

TABLE 3

| Frit | SiO$_2$ | PbO | B$_2$O$_3$ | Li$_2$O | TiO$_2$ | Ag$_2$O | SnO$_2$ | TeO$_2$ |
|---|---|---|---|---|---|---|---|---|
| 1 | 8.40 | 60.90 | | 1.47 | 0.93 | | 0.70 | 27.60 |
| 2 | | 46.04 | | 0.40 | 4.18 | | | 49.38 |
| 3 | | 46.78 | | 0.83 | 2.22 | | | 50.17 |
| 4 | | 47.43 | | 0.85 | 0.84 | | | 50.88 |
| 5 | | 33.77 | | 2.39 | 2.13 | | | 61.71 |
| 6 | | 45.35 | | 0.48 | 0.43 | | | 53.74 |
| 7 | | 36.19 | | 1.99 | 1.77 | | | 60.05 |
| 8 | | 37.35 | | 2.39 | 2.13 | | | 58.13 |
| 9 | | 36.19 | | 1.82 | 3.06 | | | 58.94 |
| 10 | | 40.81 | | 2.39 | 2.13 | | | 54.67 |
| 11 | | 44.28 | | 0.16 | 0.42 | 12.29 | | 42.84 |
| 12 | | 40.81 | | 0.59 | 1.57 | 9.08 | | 47.95 |
| 13 | | 40.81 | | 1.90 | 1.12 | | | 56.16 |
| 14 | | 45.77 | 1.09 | 0.80 | 0.71 | | | 51.64 |
| 15 | | 41.20 | | 0.34 | 2.30 | | | 56.16 |
| 16 | | 44.31 | 0.52 | 0.46 | 0.96 | 3.57 | | 50.17 |
| 17 | | 42.92 | 0.54 | 0.78 | 1.31 | | | 54.44 |
| 18 | | 42.22 | | 0.91 | 1.53 | | | 55.35 |

The lead-tellurium-lithium-titanium-oxide (Pb—Te—Li—Ti—O) compositions of Table 4 were prepared by mixing and blending amounts of Pb$_3$O$_4$, TeO$_2$, Li$_2$CO$_3$ and TiO$_2$ powders, and optionally, as shown in Table 2, B$_2$O$_3$, ZnO, Nb$_2$O$_5$, Ag$_2$O, CeO$_2$, and/or V$_2$O$_5$ to provide compositions of the oxides with the weight percentages shown in Table 4, based on the weight of the total glass composition.

TABLE 4

| Frit | PbO | B$_2$O$_3$ | ZnO | Nb$_2$O$_5$ | Li$_2$O | TiO$_2$ | CeO$_2$ | V$_2$O$_5$ | TeO2 |
|---|---|---|---|---|---|---|---|---|---|
| 19 | 42.27 | | | | 0.94 | 1.51 | | 2.87 | 52.40 |
| 20 | 42.57 | | | 4.13 | 0.92 | 1.54 | | | 50.85 |
| 21 | 45.26 | 0.86 | 2.25 | | 0.55 | 0.49 | 1.06 | | 49.53 |

In one embodiment, the Pb—Te—Li—Ti—O may be a homogenous powder. In a further embodiment, the Pb—Te—Li—Ti—O may be a combination of more than one powder, wherein each powder may separately be a homogenous population. The composition of the overall combination of the 2 powders is within the ranges described above. For example, the Pb—Te—Li—Ti—O may include a combination of 2 or more different powders; separately, these powders may have different compositions, and may or may not be within the ranges described above; however, the combination of these powders is within the ranges described above.

In an embodiment, the Pb—Te—Li—Ti—O composition may include one powder which includes a homogenous powder including some but not all of the desired elements of the Pb—Te—Li—Ti—O composition, and a second powder, which includes one or more of the other desired elements. For example, a Pb—Te—Li—Ti—O composition may include a first powder including Pb, Te, Li, and O, and a second powder including Ti$_2$. In an aspect of this embodiment, the powders may be melted together to form a uniform composition. In a further aspect of this embodiment, the powders may be added separately to a thick film composition.

In an embodiment, some or all of any Li$_2$O may be replaced with Na$_2$O, K$_2$O, Cs$_2$O, or Rb$_2$O, resulting in a glass composition with properties similar to the compositions listed above. In this embodiment, the total alkali metal content will be that described above for $Li_2O$.

The conductive composition can further contain a second glass frit in addition to the Pb—Te—O. Pb—B—Si glass frit, Pb—Si—Al glass frit, Bi—B—Si glass frit, or mixtures thereof can be added.

Organic Medium

The inorganic components of the composition are mixed with an organic medium to form viscous thick-film pastes or less viscous inks having suitable consistency and rheology for printing. A wide variety of inert viscous materials can be used as the organic medium. The organic medium can be one in which the inorganic components are dispersible with an adequate degree of stability during manufacturing, shipping and storage of the pastes or inks, as well as on the printing screen during a screen-printing process.

Suitable organic media have rheological properties that provide stable dispersion of solids, appropriate viscosity and thixotropy for printing, appropriate wettability of the substrate and the paste solids, a good drying rate, and good firing properties. The organic medium can contain thickeners, stabilizers, surfactants, and/or other common additives. One such thixotropic thickener is Thixatrol® (Elementis plc, London, UK). The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, texanol, terpineol, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also comprise volatile liquids to promote rapid hardening after application of the paste composition on a substrate.

The optimal amount of organic medium in the composition is dependent on the method of applying the composition and the specific organic medium used. The instant composition contains 5 to 25 wt % of organic medium, based on the total weight of the composition.

If the organic medium comprises a polymer, the polymer typically comprises 8 to 15 wt % of the organic composition.

Inorganic Additive

The conductive composition can further contain an inorganic additive. The inorganic additive can contribute to an increase in solder adhesion.

The particle size of the additional metal/metal oxide additives is not subject to any particular limitation, although an average particle size should be no more than 10 μm.

The inorganic additive can be a metal or metal oxide in one embodiment. The inorganic additive can be selected from a group consisting of (a) a metal selected from Li, Ru, Gd, Ce, Zr, Ti, Mn, Sn, Co, Fe, Cu, and Cr; (b) a metal oxide of one or more of the metals of (a), and (c) any compounds that can generate metals of (a) and/or metal oxides of (b) upon firing; and (d) mixtures thereof, in further embodiment.

In another embodiment, the inorganic additive can be lithium ruthenium oxide ($LiRu_2O_3$), ion-exchanged $Li_2RuO_3$ or a mixture thereof. "Ion-exchanged $Li_2RuO_3$" is used herein to describe particles of $Li_2RuO_3$ in which Li atoms have been at least partially exchanged for Al, Ga, K, Ca, Mn, Fe, Mg, H, Na, Cr, Co, Ni, V, Cu, Zn, Ti or Zr atoms, or a combination thereof. The ion-exchanged $Li_2RuO_3$ is described by the formula $M^{+1}_xM^{+2}_yM^{+3}_zLi_{2-x-2y-3z}RuO_3$ where $(x+2y+3z) \leq 1.5$, and where M is selected from one or more members of the group consisting of Al, Ga, K, Ca, Mn, Fe, Mg, Na, H, Cr, Co, Ni, V, Cu, Zn, Ti and Zr. The Li-only layer of the $Li_2RuO_3$ structure is believed to contain about 75 mole % of the lithium in the structure, and these lithium ions may be readily removed via ion exchange. Although the lithium ions are mobile in the Li-only layer of $Li_2RuO_3$, cations which have higher valence than Li (such as $Mg^{+2}$ or $Al^{+3}$) are less mobile because of their higher charge and concomitant stronger bonding. Thus, it is believed that the exchanging ion, such as magnesium, first displaces lithium ions at or near the surface of the particle, and in the layer that is Li-only, and remains in essentially that position.

Preparation of the Composition

In one embodiment, the composition can be prepared by mixing the electrically conductive metal, the Rh-containing component, the glass frit, and the organic medium in any order. In some embodiments, the inorganic materials are mixed first, and they are then added to the organic medium. In other embodiments, the electrically conductive metal which is the major portion of the inorganics is slowly added to the organic medium. The viscosity can be adjusted, if needed, by the addition of solvents. Mixing methods that provide high shear are useful.

Formation of Electrodes

The composition can be deposited, for example, by screen-printing, plating, extrusion, ink-jet printing, shaped or multiple printing, or ribbons.

In this electrode-forming process, the composition is typically first dried and then heated to remove the organic medium, sinter the inorganic materials and firmly fix them on the substrate. The heating can be carried out in air or an oxygen-containing atmosphere. This step is commonly referred to as "firing." The firing temperature profile is typically set so as to enable the burnout of organic binder materials from the dried paste composition, as well as any other organic materials present. However, the applied conductive composition can be also directly fired without undergoing a drying step.

The firing process can be carried out in a furnace. The firing conditions vary depending on the substrate type and the properties of the conductive composition. However, the electrode can be generally obtained by firing the conductive composition at a setting peak temperature of 400° C. to 1000° C. in one embodiment, at a setting peak temperature of 520° C. to 980° C. in another embodiment, and at a setting peak temperature of 600° C. to 900° C. in a further embodiment. The firing time can be 10 seconds to 1 hour in one embodiment and 30 seconds to 40 minutes in another embodiment.

In one embodiment, the firing temperature is 700° C. to 950° C. The firing can be conducted in a belt furnace using high transport rates, for example, 100-500 cm/min, with resulting hold-up times of 0.03 to 5 minutes. Multiple temperature zones, for example 3 to 11 zones, can be used to control the desired thermal profile.

The conductive composition can be applied to various substrates. For example, a metal substrate, a ceramic substrate, a glass substrate, or a semiconductor substrate can be used. The substrate can comprise an insulating layer formed on at least one surface of the substrate.

When the substrate is a semiconductor substrate containing a semiconductor layer, the insulating layer is not always necessary. The electrode can be directly formed on the semiconductor layer, or the electrode can be formed on the insulating layer of the semiconductor substrate. In an embodiment, the semiconductor substrate can comprise a semiconductor layer and an insulating layer on at least surface of the semiconductor layer.

The electrode is soldered to electrically interconnect with another electrical device. A solder ribbon, for example, copper coated with solder of Sn/Pb/Ag, Sn/Pb or Pb-free Sn/Bi can be used. Soldering is carried out typically at 200° C. to 350° C. for 5 seconds with a flux.

The electrode has significant solder adhesion and adhesion to the substrate. The solder adhesion can be measured with a machine, for example "Peel Force 606 (MOGRL Technology Co., Ltd.). The electrode can be used in any electrical device, for example a resistor, a capacitor, circuit on substrate, semiconductor device such as LED device or solar cell.

One example of tan electrical device having the electrode is solar cell. The solar cell has a bus electrode to electrically interconnect solar cells by soldering a metal wire such as the solder ribbon. The bus electrode on the front side of a solar cell can be connected to another bus electrode on the back side of the next solar cell by soldering a metal wire, thereby form a solar cell module.

In one embodiment, a semiconductor device is manufactured from an article comprising a junction-bearing semiconductor substrate and a silicon nitride insulating film formed on a main surface thereof. The instant composition is applied (e.g., coated or screen-printed) onto the insulating film, in a predetermined shape and thickness and at a predetermined position. The instant composition has the ability to penetrate the insulating layer. Firing is then carried out and the composition reacts with the insulating film and penetrates the insulating film, thereby effecting electrical contact with the silicon substrate and as a result the electrode is formed.

An example of this method of forming the electrode is described below in conjunction with FIGS. 1A-1F.

FIG. 1A shows a single crystal or multi-crystalline p-type silicon substrate 10.

Figure 1B:
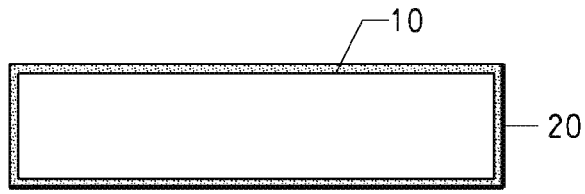

In FIG. 1B, an n-type diffusion layer 20 of the reverse conductivity type is formed by the thermal diffusion of phosphorus using phosphorus oxychloride as the phosphorus source. In the absence of any particular modifications, the diffusion layer 20 is formed over the entire surface of the silicon p-type substrate 10. The depth of the diffusion layer can be varied by controlling the diffusion temperature and time, and is generally formed in a thickness range of about 0.3 to 0.5 microns. The n-type diffusion layer may have a sheet resistivity of several tens of ohms per square up to about 120 ohms per square.

Figure 1C:

After protecting the front surface of this diffusion layer with a resist or the like, as shown in FIG. 1C the diffusion layer 20 is removed from the rest of the surfaces by etching so that it remains only on the front surface. The resist is then removed using an organic solvent or the like.

Figure 1D:
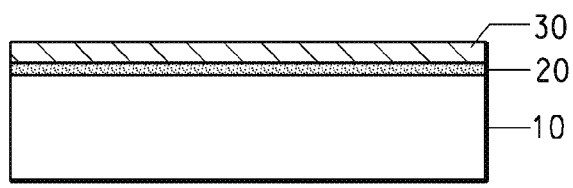

Then, as shown in FIG. 1D an insulating layer 30 which also functions as an anti-reflection coating (ARC) is formed on the n-type diffusion layer 20. The insulating layer is commonly silicon nitride, but can also be a $SiN_x$:H film (i.e., the insulating film comprises hydrogen for passivation during subsequent firing processing), a titanium oxide film, a silicon oxide film, or a silicon oxide/titanium oxide film. A thickness of about 700 to 900 Å of a silicon nitride film is suitable for a refractive index of about 1.9 to 2.0. Deposition of the insulating layer 30 can be by sputtering, chemical vapor deposition, or other methods.

Figure 1E:
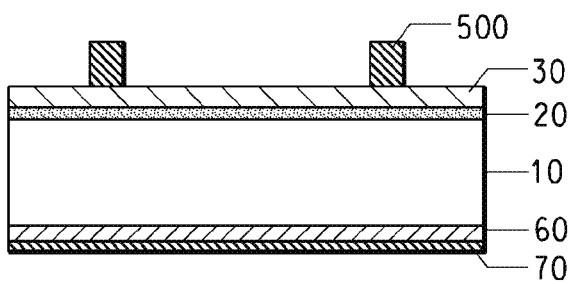

Next, electrodes are formed. As shown in FIG. 1E, the electrically conductive composition of the present invention 500 is screen-printed to create the front electrode on the insulating film 30 and then dried. In addition, a back side silver or silver/aluminum paste 70, and an aluminum paste 60 are then screen-printed onto the back side of the substrate and successively dried. The electrically conductive composition of the present invention can be used as the electrically conductive composition 500 on the front side and/or the electrically conductive composition 70 on the back side.

Firing can be carried out by using a furnace, with the peak setting temperature of 600° C. to 1000° C. for 1 second to 15 minutes. In another embodiment, the peak setting temperature can be from 400° C. to 600° C. for 5 seconds to 23 minutes, or over 600° C. for 3 seconds to 19 minutes. Total firing time can be 10 seconds to 30 minutes in one embodiment, 20 seconds to 15 minutes in another embodiment, and 30 seconds to 5 minutes in still another embodiment. When firing under such conditions, the electrodes can be formed with less damage to the semiconductor layer.

Figure 1F:
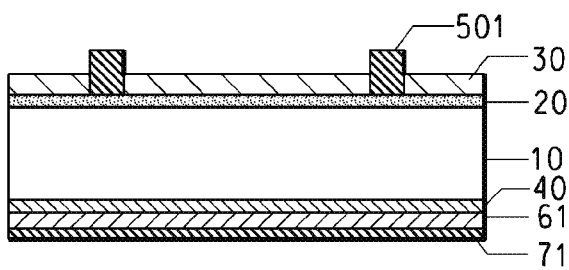

Consequently, as shown in FIG. 1F, during firing, aluminum diffuses from the aluminum paste 60 into the silicon substrate 10 on the back side thereby forming a p+ layer 40 containing a high concentration of aluminum dopant. This layer is generally called the back surface field (BSF) layer, and helps to improve the energy conversion efficiency of the solar cell.

Firing converts the dried aluminum paste 60 to an aluminum back electrode 61. The back side silver or silver/aluminum paste 70 is fired at the same time, becoming a silver or silver/aluminum back electrode, 71. During firing, the boundary between the back side aluminum and the back side silver or silver/aluminum assumes the state of an alloy, thereby achieving electrical connection. Most areas of the back electrode are occupied by the aluminum electrode 61, owing in part to the need to form a p+ layer 40. Because soldering to an aluminum electrode is impossible, the silver or silver/aluminum back electrode 71 is formed over portions of the back side as an electrode for interconnecting solar cells by means of copper ribbon or the like. In addition, the front side electrically conductive composition 500 of the present invention sinters and penetrates through the insulating film 30 during firing, and thereby achieves electrical contact with the n-type layer 20. This type of process is generally called "fire through." The fired electrode 501 of FIG. 1F clearly shows the result of the fire through.

EXAMPLES

The present invention is illustrated by, but is not limited to, the following examples.

Examples 1-4 Comparative Experiment A

A conductive composition containing an electrically conductive metal, a Rh-containing component, a Pb—Te—O and an organic medium was prepared with the following materials and procedure. The amounts of the materials are shown in Table 5. Weight percent (wt %) is herein based on the total weight of the conductive composition.

The Ag powder (the conductive metal) in spherical form and the Pb—Te—O were dispersed into a mixture of ethylcellulose, texanol and Rh resinate (the Rh-containing component) and mixed for 15 minutes to form the conductive composition. The conductive composition was then repeatedly passed through a 3-roll mill at progressively increasing pressures from 0 to 400 psi. The degree of the dispersion was measured by fineness of grind (FOG). A typical FOG value was adjusted to 20/10 or less.

Examples 1 and 2 contained the silver powder, the Pb-te-o, the Rh resinate and the organic medium. In addition to the above components, a Pb—B—Si glass frit and LiRu$_2$O$_3$ were dispersed into the organic medium of Examples 3 and 4, respectively. Comparative Experiment A contained only the silver powder, the Pb-te-o, and the organic medium.

Each of the five conductive compositions obtained above was screen printed by a thick film printer (SERIA, SSA-PC250E-IP, Tokai Shoji Co., Ltd.) onto a silicon nitride (SiN$_x$) film formed on a silicon (Si) wafer through a 250 mesh screen mask with two line patterns which were bus electrodes, 2 mm wide, 153 mm long and 60 μm thick with finger lines crossing the two line patterns. The Si wafer was square, 156 mm on a side. The printing pressure was 3 to 5 kg.

The printed conductive composition was dried at 150° C. for 5 minutes in an oven.

Solar cell electrodes were obtained by firing the dried conductive composition in a belt furnace (CF-7210, Despatch Industry) at a peak temperature setting of 945° C. The furnace set peak temperature of 945° C. corresponded to a measured temperature at the upper surface of the silicon substrate of 750° C. Firing time from entrance to exit of the furnace was 60 seconds. The firing setting condition was 400° C. to 600° C. for 12 seconds, and over 600° C. for 6 seconds. The belt speed of the furnace was 550 cpm.

The thickness of the electrodes after firing was 10±2 μm.

Adhesion of the electrode was measured by the following procedure. A copper ribbon coated with a Sn/Pb solder (Ulbrich Stainless Steels&Special Metals, Inc.) was dipped into a soldering flux (Kester-952s, Kester, Inc.) and then dried for five seconds in air. Half of the solder coated copper ribbon was placed on the bus electrode and soldering was done with a soldering system (SCB-160, SEMTEK Corporation Co., Ltd.). The soldering iron setting temperature was 220° C. to 240° C. and the actual temperature of the soldering iron at the tip was from 195° C. to 215° C. measured by K-type thermocouple.

The part of the copper ribbon which was not attached to the bus electrode was horizontally folded and pulled at 120 mm/min by a machine (Peel Force 606, MOGRL Technology Co., Ltd.). The strength (Newton, N) at which the copper ribbon was detached was recorded as the solder adhesion. The results of the adhesion measurements are shown in Table 5 for each composition.

The adhesion of the electrodes of Examples 1 and 2 were 1.5 N and 3.0 N, respectively. The solder adhesion of the electrode of Comparative Experiment (Comp. Exper.) A was just 1.3 N as shown in Table 5. The adhesion of electrodes of Examples 3 and 4 with their compositions further containing Pb—B—Si glass frit and LiRu$_2$O$_3$, respectively, and less Rh resinate than Example 2 were 2.2 and 3.2, respectively.

TABLE 5

| Composition | Comp. Exper. A | Example 1 | Example 2 | Example 3 | Example 4 |
|---|---|---|---|---|---|
| Ag powder[1] | 88.8 | 88.7 | 88.7 | 88.4 | 88.7 |
| Pb—Te—O | 2.0 | 2.0 | 2.0 | 2.0 | 2.0 |
| Rh resinate[2] | 0.00 | 0.10 | 0.15 | 0.10 | 0.10 |
| Organic medium | 9.2 | 9.2 | 9.2 | 9.2 | 9.2 |
| Pb—B—Si glass frit | 0 | 0 | 0 | 0.35 | 0 |
| LiRu$_2$O$_3$ | 0 | 0 | 0 | 0 | 0.05 |

TABLE 5-continued

| Composition | Comp. Exper. A | Example 1 | Example 2 | Example 3 | Example 4 |
|---|---|---|---|---|---|
| Solder Adhesion (N) | 1.3 | 1.5 | 3.0 | 2.2 | 3.2 |

[1] D$_{50}$: 1.9 μm
[2] CAS No.: 20845-92-5, rhodium content 10 wt % of the Rh resinate

What is claimed is:

1. An electrically conductive composition comprising:
   (a) an electrically conductive metal;
   (b) a Rh-containing component;
   (c) a Pb—Te—O, wherein the Pb—Te—is (i) Pb—Te—B—O comprising 25 to 75 wt % of PbO, 10 to 70 wt % of TeO$_2$, 0.15 to 15 wt % of B$_2$O$_3$ and 0-5 wt % V$_2$O$_5$ or (ii) Pb—Te—Li—O comprising 30 to 60 wt % of PbO, 40 to 65 wt % of TeO$_2$, 0.1 to 5 wt % of Li$_2$O and 0-5 wt % V$_2$O$_5$, wherein said wt % are based on the weight of the total starting mixture; and
   (d) an organic medium;
wherein said electrically conductive metal, said Rh-containing compound, and said Pb—Te—O are dispersed in said organic medium.

2. The composition of claim 1, said composition comprising 75-92 wt % electrically conductive metal, 0.001-10 wt % Rh-containing component, 0.5-10 wt % Pb—Te—O and 5-25 wt % organic medium, wherein said wt % are based on the total weight of said composition.

3. The composition of claim 2, said composition comprising, 0.09-2 wt % Rh-containing component.

4. The composition of claim 1, said electrically conductive metal comprising a metal selected from the group consisting of silver (Ag), nickel (Ni), copper (Cu), aluminum (Al), palladium (Pd), ruthenium (Ru) and mixtures thereof.

5. The composition of claim 1, said electrically conductive metal comprising silver.

6. The composition of claim 1, wherein said Rh-containing component is selected from the group consisting of rhodium resinate, rhodium containing metal powder, rhodium oxide (RhO$_2$, Rh$_2$O$_3$), rhodium bromide (RhBr$_2$, RhBr$_3$), rhodium chloride (RhCl$_2$, RhCl$_3$), rhodium fluoride (RhF$_3$, RhF$_4$, RhF$_5$, RhF$_6$), rhodium iodide (RhI$_2$.RhI$_3$), rhodiumdiacetate (Rh(CH3COO)$_2$), Rh(CN)$_3$, Rh$_4$(CO)$_{12}$, rhodium nitrate (Rh(NO$_3$)$_3$), rhodium hydroxide (Rh(OH)$_3$, Rh(OH)$_4$) and mixtures thereof.

7. The composition of claim 1, wherein said Rh-containing component is rhodium resinate.

8. A process for forming an electrode, the process comprising: (a) providing an article comprising a semiconductor substrate; (b) applying a composition of claim 1 onto the article; and (c) firing the article and the composition wherein the organic medium of the thick film paste is volatilized, thereby forming the electrode.

9. An electrical device comprising an electrode formed from the composition of any of claims 1-7, wherein said composition has been fired to remove the organic medium and form said electrode.

10. The electrical device of claim 9, wherein said electrical device is a solar cell.

* * * * *

UNITED STATES PATENT AND TRADEMARK OFFICE
CERTIFICATE OF CORRECTION

PATENT NO.        : 8,916,069 B2
APPLICATION NO.   : 13/572871
DATED             : December 23, 2014
INVENTOR(S)       : Kazutaka Ozawa et al.

It is certified that error appears in the above-identified patent and that said Letters Patent is hereby corrected as shown below:

In the Claims

In Column 16, Claim 1, Line 14, please change "Pb-Te-is" to read -- PB-Te-O is --.

Signed and Sealed this
Twenty-first Day of April, 2015

Michelle K. Lee
*Director of the United States Patent and Trademark Office*